(12) United States Patent
Hua et al.

(10) Patent No.: US 7,495,462 B2
(45) Date of Patent: *Feb. 24, 2009

(54) METHOD OF WAFER-LEVEL PACKAGING USING LOW-ASPECT RATIO THROUGH-WAFER HOLES

(75) Inventors: Yaping Hua, Wuxi (CN); Zongya Li, Wuxi (CN); Yang Zhao, Andover, MA (US)

(73) Assignee: Memsic, Inc., North Andover, MA (US)

( * ) Notice: Subject to any disclaimer, the term of this patent is extended or adjusted under 35 U.S.C. 154(b) by 211 days.

This patent is subject to a terminal disclaimer.

(21) Appl. No.: 11/505,046

(22) Filed: Aug. 16, 2006

(65) Prior Publication Data

US 2006/0273430 A1 Dec. 7, 2006

Related U.S. Application Data

(63) Continuation-in-part of application No. 11/088,633, filed on Mar. 24, 2005, now Pat. No. 7,262,622.

(51) Int. Cl.
*G01R 31/02* (2006.01)
(52) U.S. Cl. .................................................. 324/763
(58) Field of Classification Search .................. None
See application file for complete search history.

(56) References Cited

U.S. PATENT DOCUMENTS

| | | | | |
|---|---|---|---|---|
| 6,281,046 | B1 * | 8/2001 | Lam .......................... | 438/113 |
| 6,291,884 | B1 * | 9/2001 | Glenn et al. ................. | 257/747 |
| 6,656,827 | B1 * | 12/2003 | Tsao et al. ................... | 438/612 |
| 6,818,464 | B2 * | 11/2004 | Heschel ........................ | 438/22 |
| 6,832,013 | B1 * | 12/2004 | Kuhmann et al. ............. | 385/14 |
| 6,856,717 | B2 * | 2/2005 | Kilian .......................... | 385/15 |
| 6,882,045 | B2 * | 4/2005 | Massingill et al. ........... | 257/724 |
| 6,900,532 | B1 * | 5/2005 | Kelkar et al. ................. | 257/698 |
| 6,953,985 | B2 * | 10/2005 | Lin et al. ..................... | 257/659 |
| 7,115,997 | B2 * | 10/2006 | Narayan et al. .............. | 257/769 |

(Continued)

OTHER PUBLICATIONS

Liu, Chang, "Through-Wafer Electrical Interconnects by Sidewall Photolithographic Patterning", IEEE Instrumentation and Measurement Technology Conference, St. Paul, Minnesota, May 19-21, 1998, 4 pgs.

(Continued)

*Primary Examiner*—Jermele M Hollington
(74) *Attorney, Agent, or Firm*—Weingarten, Schurgin, Gagnebin & Lebovici LLP

(57) ABSTRACT

A wafer-level packaged IC is made by attaching a cap wafer to the front of an IC base wafer before cutting the IC base wafer, i.e. before singulating the plurality of dies on the IC base wafer. The cap wafer is mechanically attached and electrically connected to the IC base wafer, then the dies are singulated. Electrically conductive paths extend through the cap wafer, between wafer contact pads on the front surface of the cap and electrical contact points on the IC base wafer. Optionally, the cap wafer contains one or more dies. The IC base wafer can be fabricated according to a different technology than the cap wafer, thereby forming a hybrid wafer-level package. Optionally, additional "upper-level" cap wafers (with or without dies) can be stacked to form a "multi-story" IC. Optionally, a hermetically-sealed cavity headroom is provided.

19 Claims, 17 Drawing Sheets

U.S. PATENT DOCUMENTS

| | | | |
|---|---|---|---|
| 7,262,622 B2* | 8/2007 | Zhao | 324/763 |
| 7,265,429 B2* | 9/2007 | Wan | 257/415 |
| 7,295,029 B2* | 11/2007 | Zhao | 324/763 |
| 2004/0266038 A1* | 12/2004 | Heschel | 438/22 |
| 2005/0269241 A1* | 12/2005 | Brooks et al. | 206/710 |
| 2007/0166958 A1* | 7/2007 | Wang | 438/460 |
| 2008/0081398 A1* | 4/2008 | Lee et al. | 438/109 |

OTHER PUBLICATIONS

Cluff et al., "Electronic Packaging Technologies", Chapter 10A.1, *Mechanical Engineering Handbook*, (Frank Kreith, Ed.), CRC Press LLC, Boca Raton, 1999, 21 pgs.

* cited by examiner

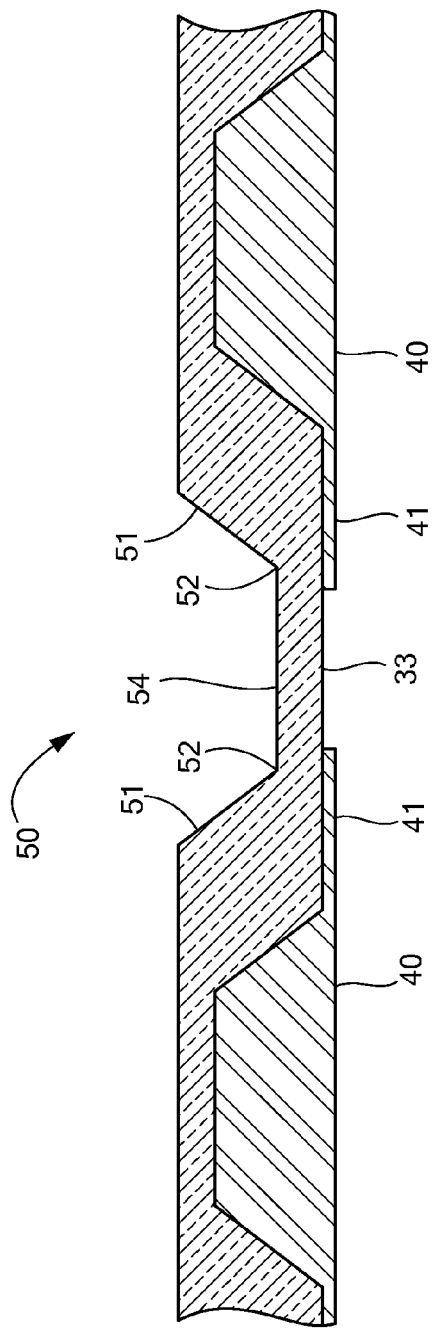
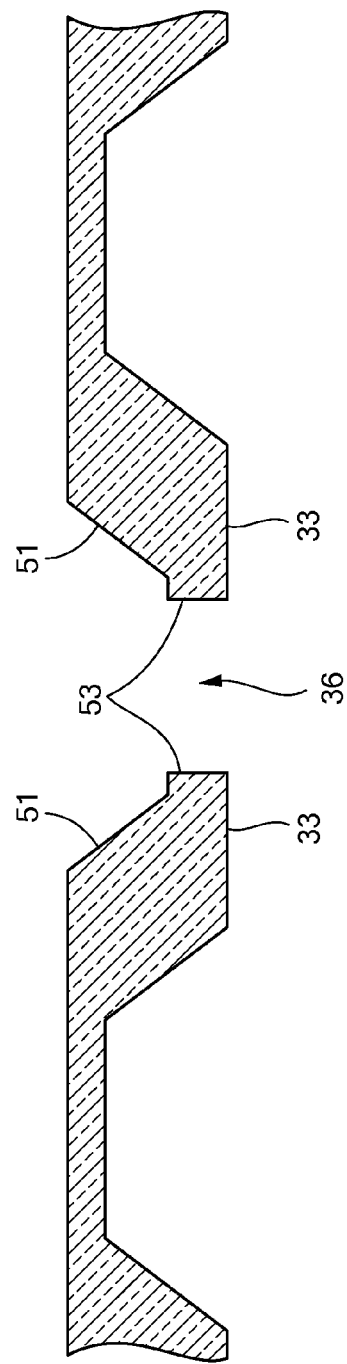
FIG. 3C
FIG. 3D

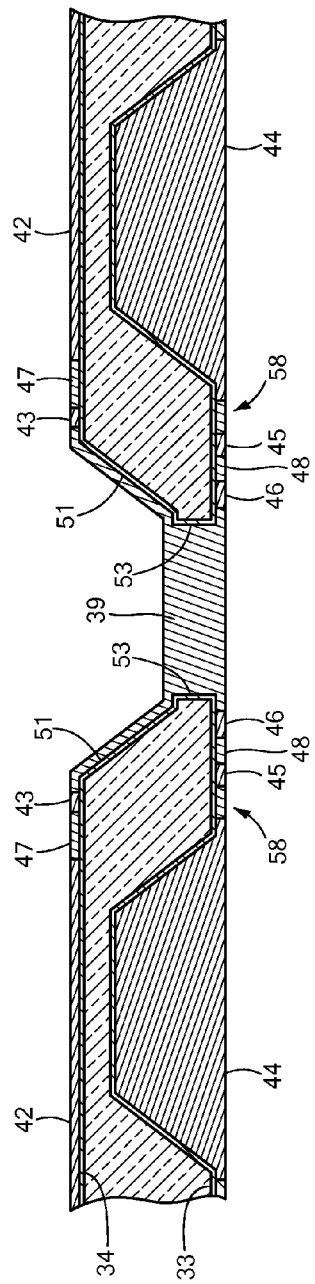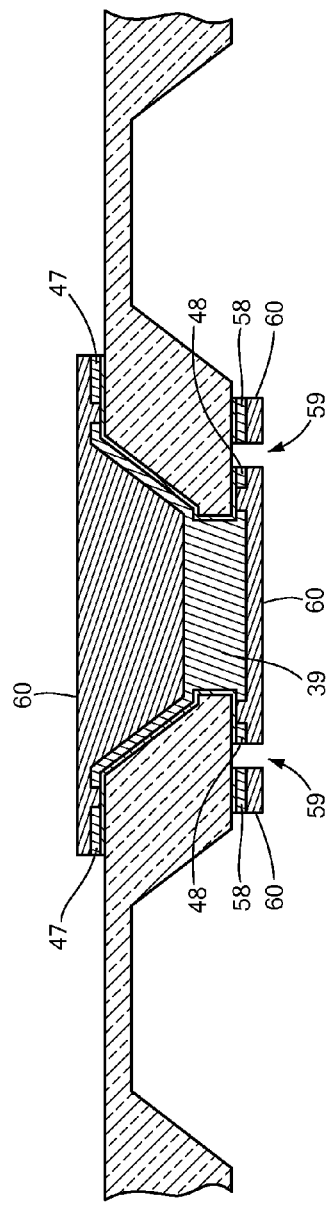

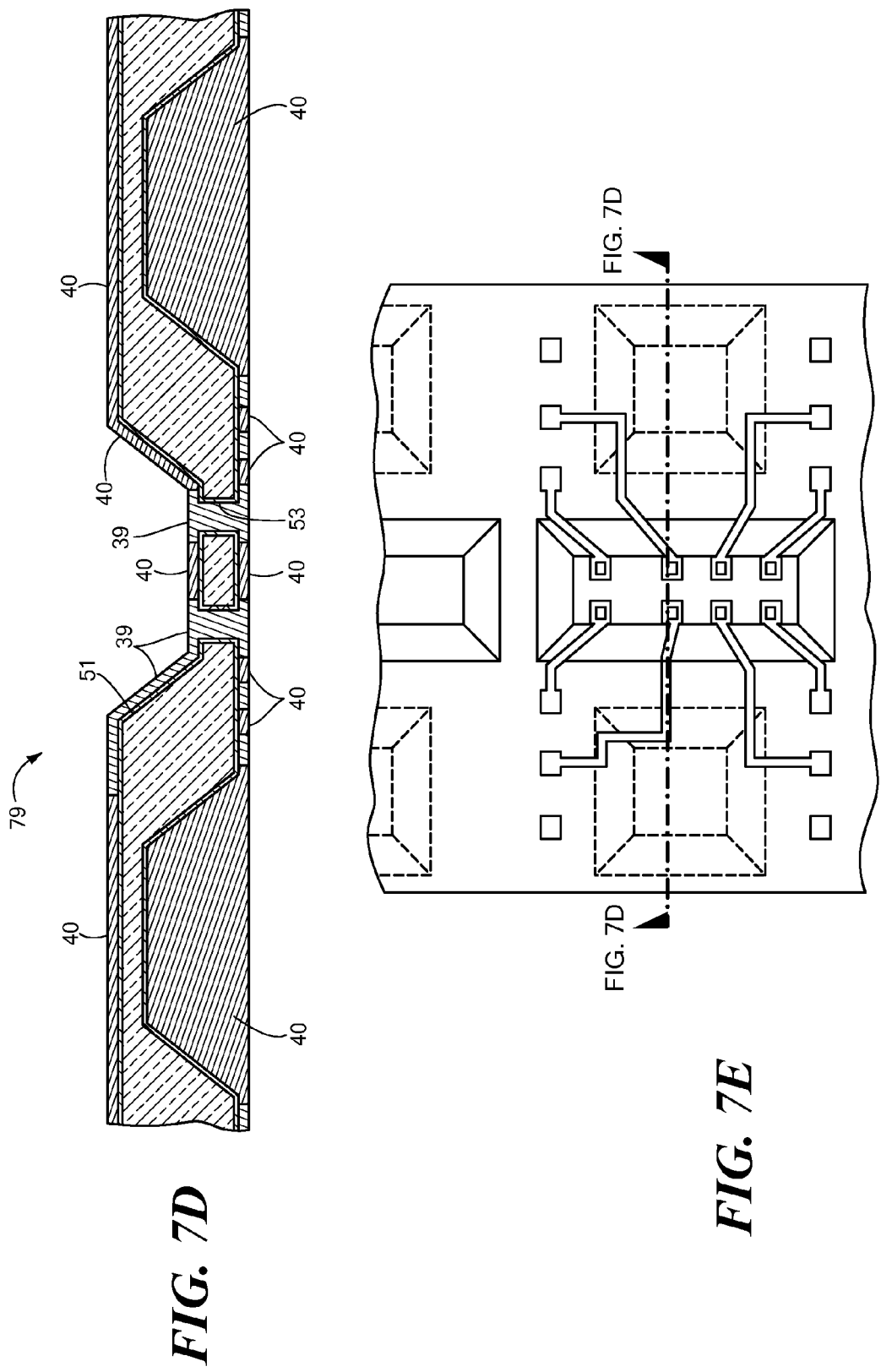

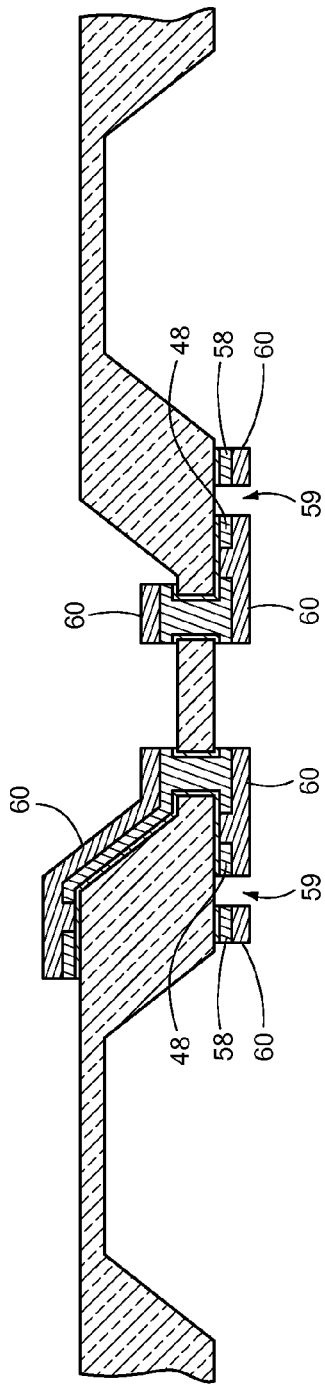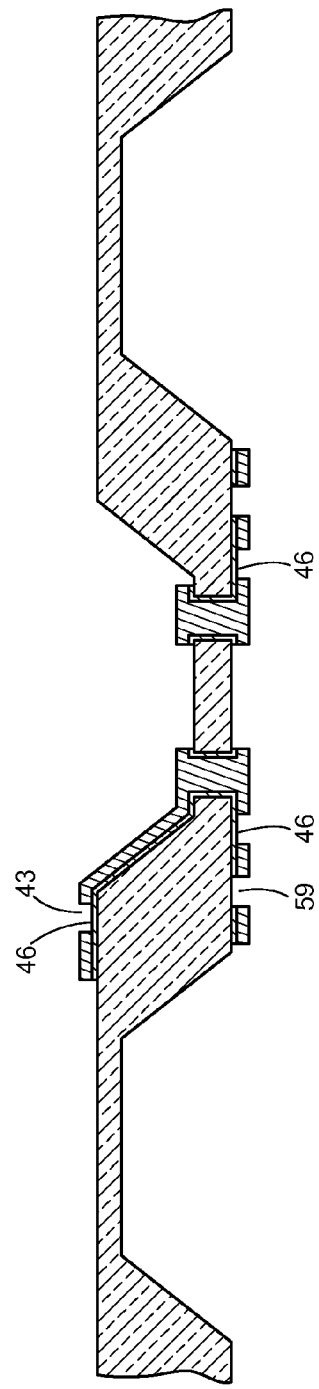

METHOD OF WAFER-LEVEL PACKAGING USING LOW-ASPECT RATIO THROUGH-WAFER HOLES

CROSS REFERENCE TO RELATED APPLICATIONS

This application is a continuation-in-part of and claims the benefit of U.S. patent application Ser. No. 11/088,633 filed on Mar. 24, 2005, now U.S. Pat. No. 7,262,622, which is incorporated herein in its entirety by reference.

STATEMENT REGARDING FEDERALLY SPONSORED RESEARCH OR DEVELOPMENT

N/A

BACKGROUND OF THE INVENTION

The present invention discloses a method of manufacturing integrated circuit ("IC") packages and, more particularly, to a method of manufacturing wafer-level packages for integrated circuits. Conventionally, IC packages are manufactured as wafers, each wafer containing many individual circuits, i.e., base wafers or dies. The wafer is fabricated and processed as a whole. After fabrication and processing, the wafer is cut, i.e., singulated, into a multiplicity of individual dies. Each base wafer or die is then encapsulated in a plastic or ceramic package or is fixedly and operationally attached to a ceramic cap.

IC base wafer fabrication is commonly referred to as the "front-end" process of IC fabrication. Packaging individual dies is commonly referred to as the "back-end" process of IC fabrication.

An IC base wafer can be fabricated relatively efficiently, because, as a rule, all dies on the wafer are fabricated concurrently, i.e., in parallel, such as by photolithographic processing. In photolithographic processing, each layer of the wafer is produced at one time, e.g., using a lithographic mask and/or a photo-resist. As a result, the time required to fabricate a wafer is largely independent of the number of dies on the wafer, but strongly dependent on the number of fabrication steps in the photolithographic process. In contrast, typically, after the dies are singulated, packaging or "back-end" processing is time consuming and expensive, because each die must be packaged individually, i.e., serially.

Dies include electrical leads, contact pads, and/or interconnects on one or more surfaces. The leads, contact pads, and/or interconnects are used to electrically-couple a completed IC die to, e.g., a printed-wire circuit board, other dies, and so forth. During "back-end" packaging, especially when a die is hermetically-sealed using a cap wafer, these interconnects are connected to associated leads, contact pads, and/or interconnects disposed on the front surface of the cap wafer. Through-wafer, electrical interconnects, or "vias", are used conventionally to connect the interconnects on the front surface of the cap wafer to associated interconnects on the back surface of the cap wafer.

Conventional methods for providing through-wafer, electrical interconnects include the use of bonding wires, through-wafer etching of holes and/or interconnects, and/or etching of side-wall interconnects. Bonding wires provided on the front surface and/or on the back surface of an IC device are common. When enclosed or encapsulated, bonding wires work satisfactorily. However, when left exposed, especially in a harsh environment, bonding wires can interfere with the operation and/or cause the failure of the IC device. Wire bonding, however, yields larger sizes and, moreover, cannot be implemented by wafer-to-wafer.

Conventional through-wafer holes and/or interconnects offer better protection from exposure to a harsh environment. However, they also have several disadvantages. First, if the IC device is relatively thin, automated machines that make the through-wafer holes can only handle the relatively thin IC device with difficulty. Relatively thin through-wafer holes also can weaken the IC device during manufacture, which can result in batch rejections.

On the other hand, if the IC or MEMS device is relatively thick, the geometry of the through-wafer holes and/or interconnects, i.e., the aspect ratio of rise (thickness) to run (length or width), it is difficult to fill high aspect ratio hole with metal or other electrically-conductive materials. It also may require a relatively large footprint on the back surface of the IC device as a function of aspect ratio and thickness between the front and back surfaces, losing valuable surface area, which can affect through-wafer hole density.

Furthermore, high aspect ratio through-wafer holes require single-wafer, dry etching. Thus, etching of relatively thick IC or MEMS devices can be time consuming, which adds to manufacturing cost. Finally, through-wafer holes that are not located at the side-walls, can interfere with the hermetically-sealed cavity, which is undesirable.

Optical lithographical methods can provide three-dimensional, side-wall patterning. Advantageously, patterned, side-wall (or vertical-wall) interconnects provide points of contacts on both the front surface and the back surface of an IC device and are, relatively speaking, minimally intrusive. Indeed, typically, vertical-wall interconnects have a relatively large aspect ratio.

However, fabricating side-wall interconnects currently requires reflecting a collimating light off of one surface, e.g., a mirror, onto a surface, i.e., the side-wall, that is disposed orthogonally or substantially orthogonally to the direction of the collimating light. As it well known in optics, when light is reflected from a surface, surface scattering can be a problem. More particularly, the reflected collimating light experiences reduced or diminished light intensity and reduced or diminished resolution. As a result, fabrication of sloped side-wall interconnects, which is to say, relatively low aspect ratio side-wall interconnects, is impractical.

Therefore, it would be desirable to provide a method of manufacturing side-wall through-wafer holes or interconnects in an IC device that does not suffer from the same disadvantages of the prior art. More specifically, it would be desirable to provide a method of manufacturing side-wall interconnects that have relatively low aspect ratios, i.e., that are sloped. Furthermore, it would be desirable to provide side-wall through-wafer holes that do not affect or influence the cavity region of the IC device.

BRIEF SUMMARY OF THE INVENTION

The present invention provides a method of manufacturing wafer-level packages for integrated circuits (ICs). Embodiments of the invention include the resulting wafer-level packed ICs and chip-scale packaged ICs. The invention also provides methods for fabricating wafer-level packaged hybrid ICs and their component modules, and embodiments of the invention include such hybrid ICs and their components.

The wafer-level packages include a base wafer that is fixedly attached to and in operational association with a cap wafer. Electrical interconnections on the front surface of the base wafer are electrically-coupled to electrical interconnections on the front surface of the cap wafer using through-wafer electrical interconnections.

The method comprises providing cavities having low-aspect ratio side-walls on both a front surface and a back surface of a polished silicon or other semiconductor substrate. Interconnection vias between adjacent front surface cavities can then be provided. A highly-electrically conductive metal/solder can be applied to surfaces of the interconnection via to provide through-wafer, low aspect ratio side-wall, electrical interconnections. Finally, the cap wafer can be attached to the base wafer to form a composite wafer. More specifically, electrical contact points disposed on the front surface of the base wafer are electrically-coupled to the through-wafer, low aspect ratio side-wall electrical interconnections on the front surface of the cap wafer and the through-wafer, low aspect ratio side-wall, electrical interconnections on the cap wafer are electrically-coupled to electrical contact points disposed on the rear surface of the cap wafer.

BRIEF DESCRIPTION OF THE SEVERAL VIEWS OF THE DRAWINGS

The foregoing and other objects, features, and advantages of the invention will be apparent from the following Detailed Description of the Invention in conjunction with the Drawings of which:

FIG. 3C is a diagram of the silicon substrate and photo-resist mask for providing interconnection vias;

FIG. 3D is a diagram of the silicon substrates with an interconnection via therebetween;

FIG. 3G is a diagram of a photo-resist mask associated with applying a metal/solder mixture to the side-walls of the interconnection via;

FIG. 3H is a diagram of a photo-resist mask associated with providing an electrical insulation portion;

FIG. 7D is a diagram of the silicon substrates with an under bump metal layer;

FIG. 7E is a diagram of a photo-resist mask associated with applying a metal/solder mixture to the side-walls of the interconnection via;

FIG. 7F is a diagram of a photo-resist mask associated with providing an electrical insulation portion;

FIG. 7G is a diagram of a composite wafer assembly having a cap wafer and base wafer;

DETAILED DESCRIPTION OF THE INVENTION

The present invention discloses a method of fabricating wafer-level-packaged integrated circuits ("IC") and their components as well as to the IC device(s) and/or packages that are fabricated according to the method. A wafer-level-packaged IC is made by fixedly and operationally attaching a protective, semiconductor cap wafer to an IC base wafer containing at least one IC. The structure formed by attaching a cap wafer to an IC base wafer is referred to herein as a "composite wafer". Composite wafers can include more than two wafers in a "multi-story" structure. However, for illustrative purposes only, a simple, "single-story" composite wafer is described and shown herein.

The cap wafer can be fabricated from silicon (Si) or other suitable materials, such as gallium arsenide (GaAs), or gallium nitride (GaN). Likewise, the IC base wafer can be fabricated using any acceptable material, such as Si, GaAs or GaN. Advantageously, the IC base wafer can be fabricated according to a different material or process technology than the cap wafer, thereby forming a hybrid composite wafer. For example, one wafer can be fabricated using Si, GaAs or GaN or any other suitable material, and the other wafer can be fabricated using another of these or other materials.

The cap wafer, typically, is approximately the same size and shape as the IC base wafer, although the cap wafer can have a larger or smaller diameter or a different shape than the IC base wafer. After fabrication, to reduce the height of the resulting package, the cap wafer can be thinned, such as by lapping, prior to subsequent processing. Any thickness cap wafer is acceptable, as long as the cap wafer and the ultimate resulting cap and package are structurally sound. The thickness of the cap wafer depends, in part, on the size, material, configuration, and other attributes of the cap wafer and the ultimate resulting package.

Figure 1:
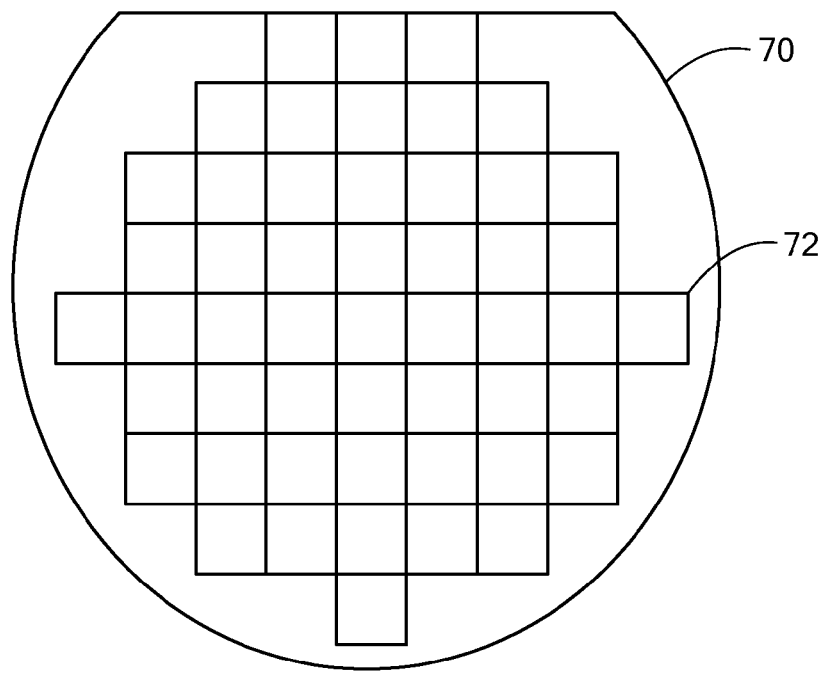
FIG. 1 is a diagram of a plan view of a circular IC base wafer.

FIG. 1 is a plan view of a typically, circular IC base wafer 70. As shown in the figure, the base wafer 70 contains a plurality of dies, such as die 72. Typically, at least one digital or analog electronic component or circuit (such as a light-emitting diode (LED), photo-sensor, microprocessor, memory, amplifier, filter or transmitter), a micro-machined or micro-electromechanical (MEMS) structure (such as a cantilevered accelerometer) or any other type or combination of IC elements is disposed on each die 72. Dies 72 on the IC base wafer 70 can be identical, or the IC base wafer 70 can contain a mixture of dies 72.

Figure 2:
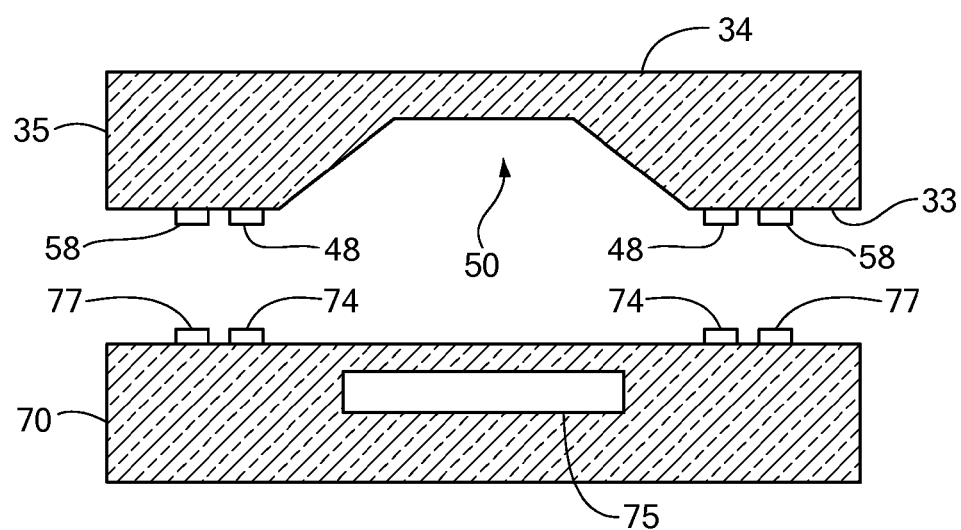
FIG. 2 is a diagram of an elevation view of a cap wafer and an IC die taken from a IC base wafer.

FIG. 2 shows an elevation view of a cap wafer 35 and a representative IC die 72 taken from the IC base wafer 70 of FIG. 1. The die 72 includes, for example, a MEMS sensor 75, that has been fabricated on the IC base wafer 70 prior to attaching the die 72 to a cap wafer 35 and/or prior to singulating the die 72. However, instead of the MEMS sensor die 75, the IC base wafer 70 can contain other types of IC dies.

The IC base wafer 70 includes at least one electrical contact point 74 that is proximate to and electrically-coupled to the MEMS sensor 75. For example, according to conventional IC packaging practices, bonding wires can be welded to these contact points 74.

On the side of the cap wafer 35 closest to the die 72, i.e., the "front surface" 33 of the cap wafer 35, the cap wafer 35 contains at least one electrical contact pad 48 that corresponds to at least one of the die's electrical contact points 74. Electrically-conductive material extends from these cap wafer contact pads 48 on the front surface 33, through the cap wafer 35 to the "back surface" 34 of the cap wafer 35. Such extensions are referred to as "through-wafer holes" or "interconnects". At the back surface 34 of the cap wafer 35, the interconnects are electrically-coupled to, for example, electrical contact points of another IC base wafer, a printed wire circuit board, and so forth.

Electrical connections 48 and 74 between the cap wafer 35 and the IC base wafer 70, respectively, can also provide the point of mechanical attachment of the cap wafer 35 to the IC base wafer 70. Alternatively, the electrical connections and the mechanical attachments can be provided by separate elements. For example, seal rings 58 and 77 can be provided on the cap wafer 35 and base wafer 70, respectively.

As shown in FIG. 2, the cap wafer 35 is positioned so that the lead wires, bumps, and/or pins of electrically-conductive material 48 and 58 on the front surface 33 of the cap wafer 35 are in registration with associated and corresponding pins and/or bumps of electrically-conductive material 74 and 77, respectively, on the base wafer 70 and, moreover, so that the integrated circuitry 75 disposed in the base wafer 70 is in registration with the cavity 50 disposed on the front surface 33 of the cap wafer 35.

Typically, bumps or dots of solder or other suitable attaching material (such as a conductive polymer or conductive epoxy) (not shown) are pre-placed on the back side ends of the electrically-conductive material. Thus, when the cap wafer 35 is attached to the IC base wafer 70, the cap wafer 35 and/or the IC base wafer 70 can be heated as necessary, depending on the material of the solder or other suitable attaching material bumps or dots, to soften or melt the bumps or dots. The pre-placed solder or other suitable attaching material attaches to, and electrically couples with, the contact points 74 of the IC base wafer 70. Thus, the sensor die(s) 75 is/are electrically-coupled to the contact pads 48 on the cap wafer 35.

The electrical connections provided by the solder bumps or dots can also be used to mechanically connect the cap wafer 35 to the IC base wafer 70. Alternatively, a separate seal ring 58 can mechanically connect the cap wafer 35 to the IC base wafer 70.

The seal ring 58 can be hermetic or non-hermetic, depending on the materials used. The seal ring 58 is made of any suitable material, such as glass, metal or metal alloy (for example gold-aluminum (AuAl), gold-tin (AuSn) or other solder, indium-gold-tin, copper-on-aluminum or nickel-on-aluminum), and of sufficient width and thickness to provide a uniform seal that complies with the frontography (such as IC circuitry) on the surface of the base wafer 70. Alternatively, the seal ring 58 is made of an epoxy, a suitable polymer or other material.

The seal ring 58 can be formed, e.g., by printing, on the front structure 33 of the cap wafer 35 so as to circumscribe each cavity 50 on the front structure 33 of the cap wafer 35. If necessary, depending on the composition of the seal ring 58, the cap wafer 35 and/or the IC base wafer 70 can be heated to soften, melt or activate the seal ring 58 when the cap wafer 35 is attached to the IC base wafer 70.

When the cap wafer 35 is attached to the IC base wafer 70, the seal ring 58 surrounds and seals the sensor die(s) 75, such as against infiltration of gas or moisture between the cap 35 and the IC base wafer 70 or, otherwise, to protect the sensor die(s) 75. The seal ring 58 can be circular, as viewed in plan (not shown), rectangular, rounded rectangular or another shape. The seal ring 58 can surround all or a portion of the contact pads, i.e. it can follow any convenient path along the wafer 35.

Optionally, instead of or in addition to the solder bumps or dots and the seal ring 58, additional solder bumps or dots, glass frits, organic epoxies or other materials (not shown) can be used to attach the cap wafer 35 to the IC base wafer 70 mechanically.

Figure 9:
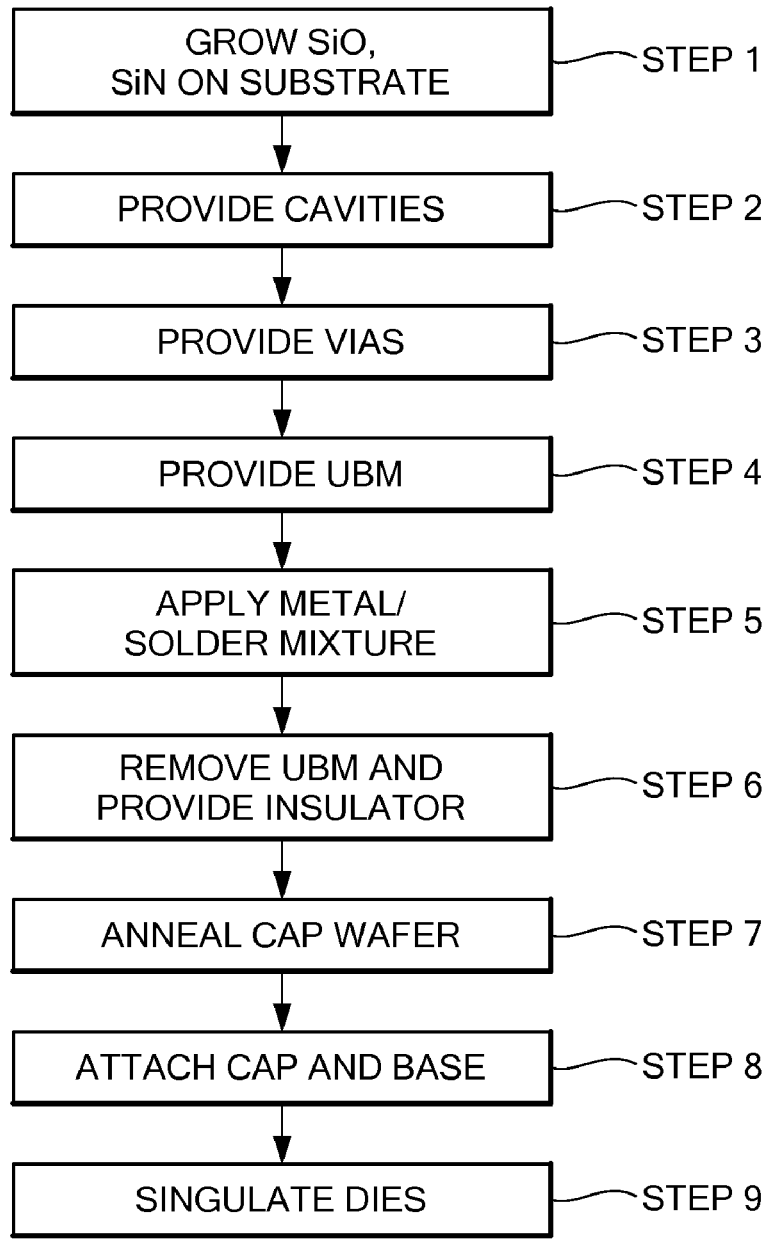
FIG. 9 is a flow chart of a method of providing through-wafer, low aspect ratio side-wall interconnects on an IC device in accordance with the present invention.

Having described a composite wafer, a method of its manufacture will now be described. A flowchart of a method of manufacturing a composite, IC wafer having through-wafer, low aspect ratio, side-wall electrical interconnects in the cap wafer is shown in FIG. 9. The method provides wafer-level, chip-scale packaging by configuring an hermetically-sealed cavity between a cap wafer and a base wafer and by configuring through-wafer, low aspect ratio, electrical interconnects on the side-walls of the cap wafer where the electrical interconnects do not affect or impact the hermetically-sealed cavity.

Figure 6:
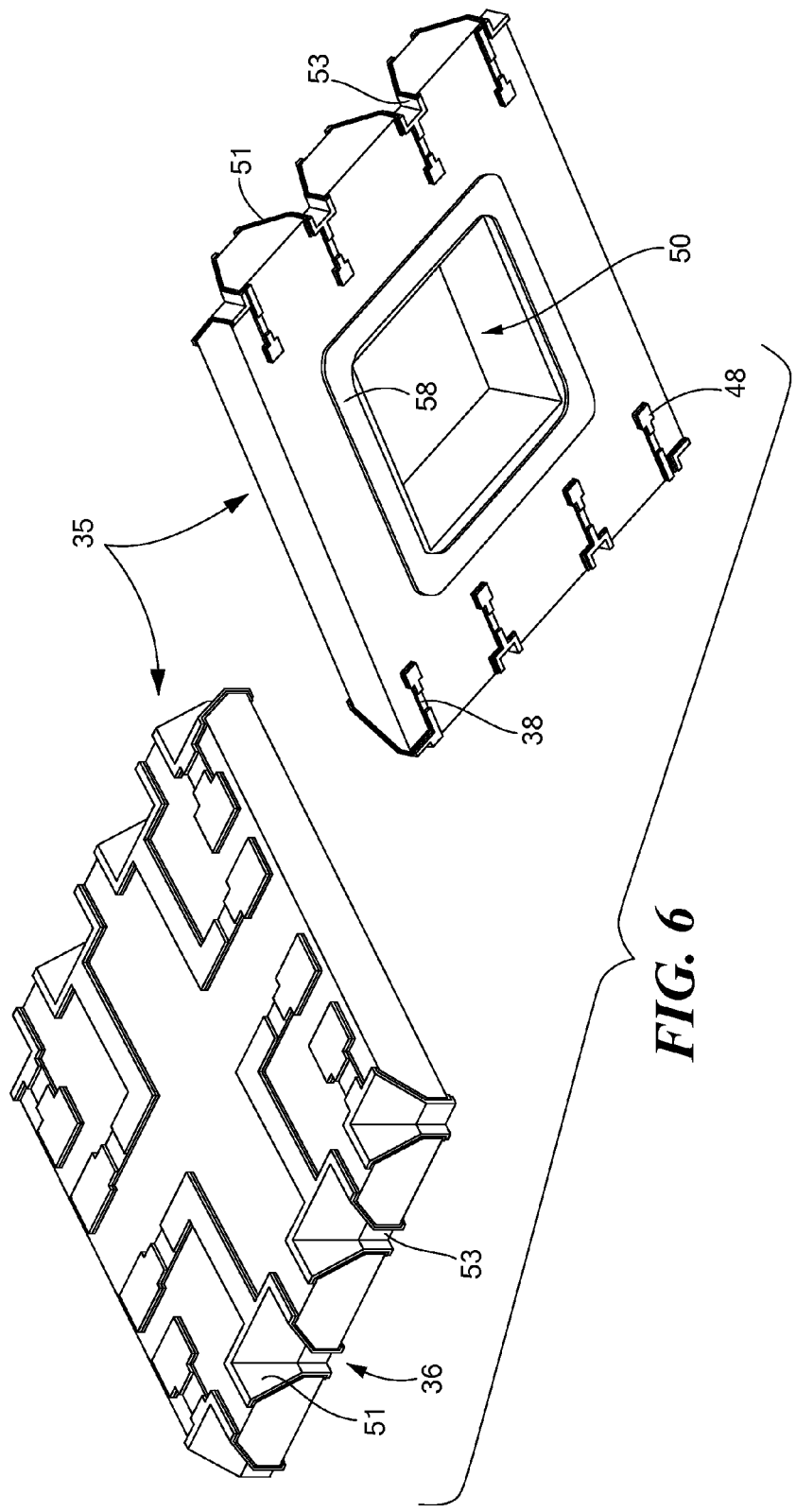
FIG. 6 is a diagram of isometric top and bottom views of the finished cap wafer.

FIGS. 3A to 3J show intermediate stages of the composite wafer-level packaged IC during fabrication. FIG. 6 shows a completed top wafer that is the end product of the stages shown in FIGS. 3A to 3J.

The manufacture of a cap wafer 35 will be disclosed. In a first step (FIG. 3A), masking layers of silicon oxide (SiO) 31 and/or silicon nitride (SiN) 32 are grown on the front surface 33 and on the back surface 34 of a polished silicon substrate 30. Growth of the SiO 31 and/or SiN layers 32 can be by silicon oxidation, by chemical vapor deposition ("CVD") or by any process known to the art (STEP 1).

When the desired layer thicknesses have been grown, a first photo-resist can be applied to the exposed SiN layer 32 on the front and back surfaces 33 and 34 of the cap wafer 35 in a desired first photo-resist pattern or mask (not shown). The purpose of the first photo-resist process is to provide a plurality of cavities 50 having low aspect ratio side-walls 51 in the silicon substrate 30 on both the front and back surfaces 33 and 34 of the cap wafer 35 (STEP 2) as shown in FIG. 3B.

First, the exposed, unmasked SiN 32 and SiO 31 layers are removed down to the surface of the silicon substrate 30, e.g., by a first, wet or dry etching. The first photo-resist can then be removed from the front and back surfaces 33 and 34 of the cap wafer 35 and a second etchant, e.g., a wet chemical etchant, can be applied to the front and back surfaces 33 and 34 of the cap wafer 35.

The first etchant applied should react with and remove the SiN layer 32 and the SiO layer 31, but should not react with the photo-resist of the silicon substrate 30. The second, wet chemical etchant applied should react with and remove desired portions of the silicon substrate 30, but should not react with the masking SiN layer 32 or the SiO layer 31. FIGS. 3A to 3J depict use of a "positive" photo-resist whereby areas not covered by the photo-resist pattern are removed. Those skilled in the art will appreciate that a negative photo-resist can also be used.

Figure 3A:
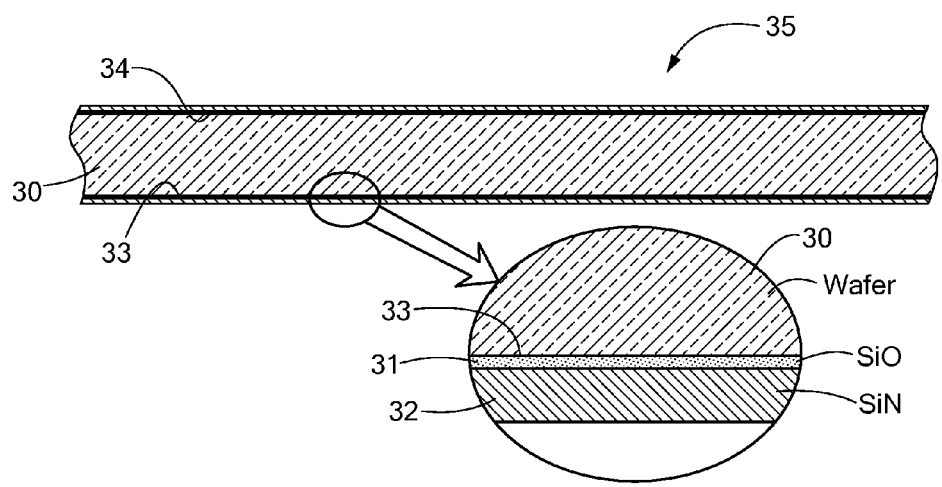
FIG. 3A is a diagram of the silicon substrate with silicon oxide and silicon nitride masking layers.
Figure 3B:
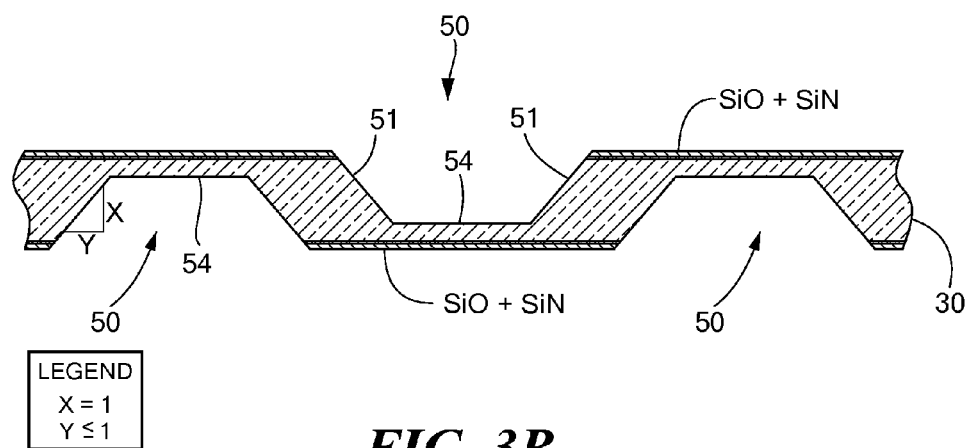
FIG. 3B is a diagram of the silicon substrate having cavities with low aspect ratio side-walls.
Figure 3E:
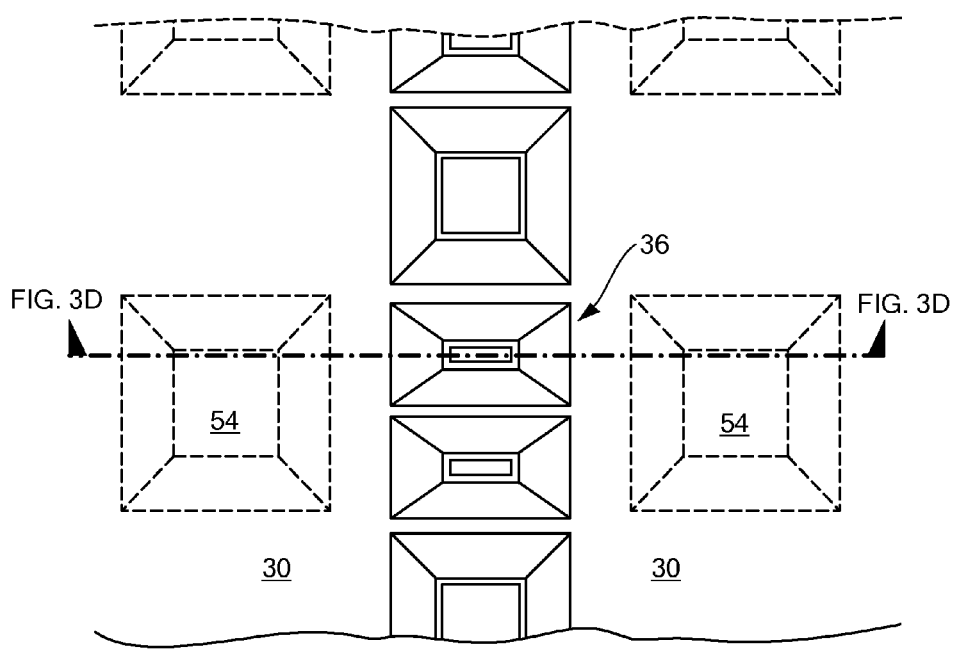
FIG. 3E is a diagram of a plan view of the silicon substrate in FIG. 3D.

As shown in FIG. 3B, systematic and controlled application of the second chemical etchant is designed to provide tetrahedral cavities 50 having four, trapezoidal side-walls 51 on four sides and a planar or substantially planar bottom portion 54. Each side-wall 51 should have a low aspect ratio (run (Y):rise (X)) on the order of about Y:1, where Y is less than or equal to unity (1).

In a next step (FIG. 3C), through-wafer hole, side-wall electrical interconnects 36, or vias, are provided between adjacent dies (STEP 3). More specifically, the SiO layers 31 and SiN layers 32 are removed from both front 33 and back surfaces 34 of the cap wafer 35 and a third photo-resist 40 can then be applied. More specifically, the third photo-resist 40 can be applied in and around the cavities 50 in the front surface 33 of the cap wafer 35 (FIG. 3C). Furthermore, the mask pattern of the photo-resist 40 includes two-dimensional extensions 41 that extend to a point beyond the terminus, or toe 52, of the sloped side-walls 51 on the back surface 34 as well as beyond some portion of the bottom portion 54 of the cavity 50.

A third wet chemical etchant or dry etching can then be applied to the front surface 33 of the cap wafer 35 only, to remove unmasked portions of the silicon substrate 30, to provide a via 36 (STEP 3). The third chemical etchant or dry etching that is applied should react with and remove desired portions of the silicon in the substrate 30 but should not react with the photo-resist 40. Care, again, should be taken to minimize scouring or undermining the silicon substrate 30 in the vicinity of the edges of the photo-resist mask 40.

As shown in FIG. 3D, once all of the desired silicon has been removed, a via 36 between adjacent cavities 50 on the front surface 33 of the cap wafer 35 is formed. The via 36 includes counterfacing low aspect ratio, side-wall portions 51 in combination with vertical or substantially vertical side-wall portions 53. A plan view of FIG. 3D (as seen from above the back surface 34) showing the cavities 50 and the via 36 is provided in FIG. 3E. The photo-resist 40 can then be removed, leaving a silicon substrate 30. As previously noted, heretofore, conventional fabrication of non-vertical, i.e., sloped, side-walls has been limited.

Figure 3F:
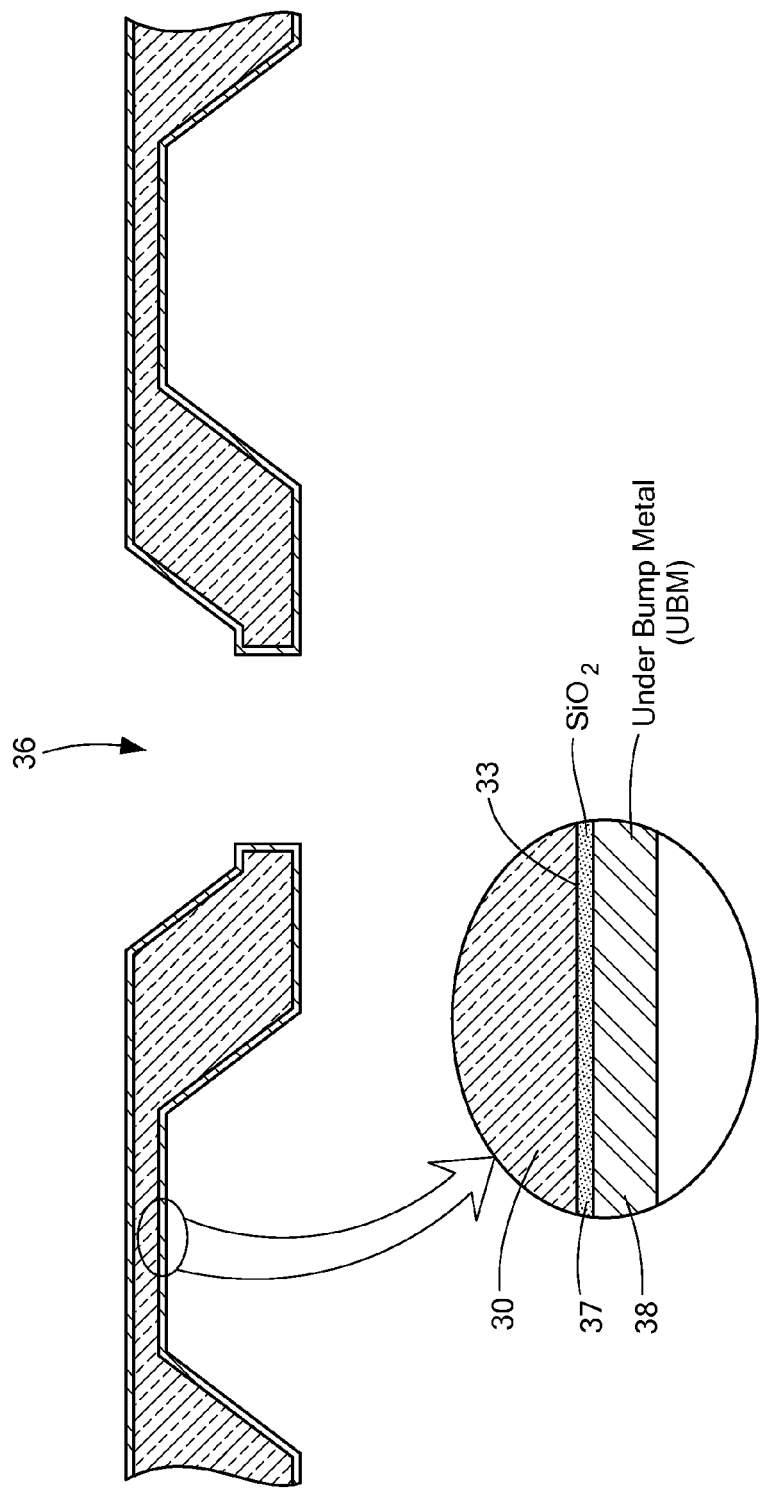
FIG. 3F is a diagram of the silicon substrates with an under bump metal layer.

Referring to FIG. 3F, a layer or film of silicon dioxide ($SiO_2$) 37 can then be grown, e.g., by direct oxidation, or deposited, e.g., by CVD, on all exposed portions of the front and back surfaces 33 and 34 of the cap wafer 35. Further, an under-bump metallization ("UBM") layer 38 can then be deposited, e.g., by chemical evaporation, sputtering, chemical plating, and the like, on the layer or film of $SiO_2$ 37 (STEP 4). The UBM layer 38 is structured and arranged to provide a strong, stable, electrical connection with the metal/solder portions described hereinafter. Typical UBM materials 38 can include aluminum, gold, nickel, titanium, tungsten, and/or any combination thereof. Thicknesses can range between about 0.1 microns and about 0.5 microns.

A fourth photo-resist mask is then applied to the UBM layer 38 on the front and back surfaces 33 and 34 and in the vias 36 of the cap wafer 35 (FIG. 3G). Photo-resist mask portions 42 and 43 on the back surface 34 of the cap wafer 35 are structured and arranged to provide a URM region 47 and to expose the UBM layer 38 along the low-aspect ratio sidewalls 51 of the via 36. Photo-resist mask portion 42 also masks the cavities 50 on the front surface 33 of the cap wafer 35.

Photo-resist solder dam portions 44, 45, and 46 on the front surface 33 of the cap wafer 35 are structured and arranged to provide an electrical contact region 48, an electric insulation portion 58, and, also, to expose the UBM layer 38 along the vertical or substantially vertical portion 53 of the via 36. Photo-resist mask portion 44 also masks the cavities 50 on the front surface 33 of the cap wafer 35.

A highly-electrically conductivity metal and solder mixture 39 are then deposited, e.g., by electro-plating, sputtering, and the like, on the front and back surfaces 33 and 34 of the cap wafer 35, against exposed portions of the UBM layer 38 that are not masked by the photo-resist portions 42-46 (STEP 5). The metal can be gold, silver, platinum, and similar metals and/or metal alloys having low electrical resistivity. The solder be can tin or other suitable material. A mixture of about 80 percent gold and about 20 percent tin is a suitable mixture.

The metal/solder mixture 39 is deposited on so as to coat and/or adhere to the exposed, unmasked UBM layer 38, and, more particularly, the exposed, unmasked UBM layer 38 covering the low-aspect ratio, side-wall portions 51 and the portions of the exposed UBM layer 38 covering the vertical or substantially vertical side-wall portions 53 of the via 36, which, in combination, form the through-wafer hole, sidewall electrical interconnection 16.

As shown in FIG. 3G, the metal/solder mixture 39 will also be deposited to cover or adhere to the exposed, unmasked UBM material 38 in the UBM region 47 between photo-resist portions 42 and 43 on the back surface 34, in the electrical contact region 48 between photo-resist portions 45 and 46 on the front surface 33, and in the sealing ring 58 between photo-resist portions 44 and 45 on the front surface 33.

As shown in FIG. 3H, after removing the photo-resist portions 44-46 on the front surface 33 of the cap wafer 35 and the photo-resist portions 42 and 43 on the back surface 34 of the cap wafer 35, a fifth photo-resist 60 is deposited so as to mask all of the metal/solder mixture portions 39, 47, 48, and 58 on the front 33 and back surfaces 34 of the cap wafer 35. The electrical insulation region 59 located between the electric contact region 48 and the sealing ring 58 on the front surface 33 of the cap wafer 35 is not covered by the fifth photo-resist 60.

A fourth wet or dry etchant is then applied so as to remove the photo-resist portions and the underlying UBM 38 that is not masked by the fifth photo-resist 60 (STEP 6). The etchant should react with so as to be able to remove the exposed, unmasked UBM layer 38 without removing the $SiO_2$ layer 37 (STEP 6), the silicon substrate 30 or the fifth photo-resist 60. Particularly, the underlying UBM 38 at the unmasked electrical insulation region 59 on the front surface 33 of the cap wafer 35 are removed down to the $SiO_2$ layer 37 (STEP 6), to provide an electrical insulation region 59 between the solder dam 48 and the sealing ring 58.

After the fifth photo-resists, UBM layers 38 have been removed, the cap wafer 35 can be annealed, e.g., at a temperature of about 450 degrees Centigrade (STEP 7). Annealing helps strengthen the metal/solder portions, and, more particularly, forms the solder dam portions 43, 45, and 46 on the front and back surfaces 33 and 34, respectively.

Figure 3I:
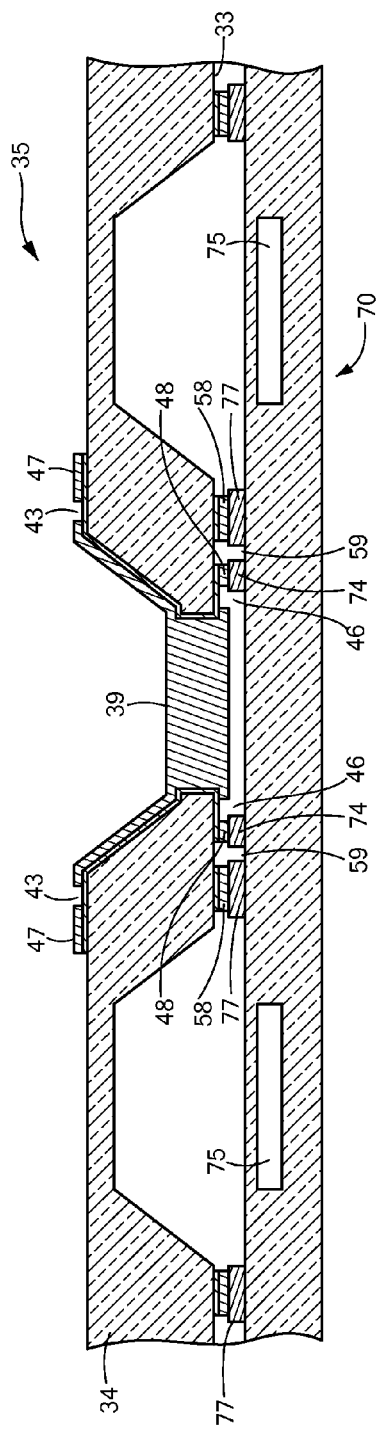
FIG. 3I is a diagram of a composite wafer assembly having a cap wafer and base wafer.
Figure 3J:
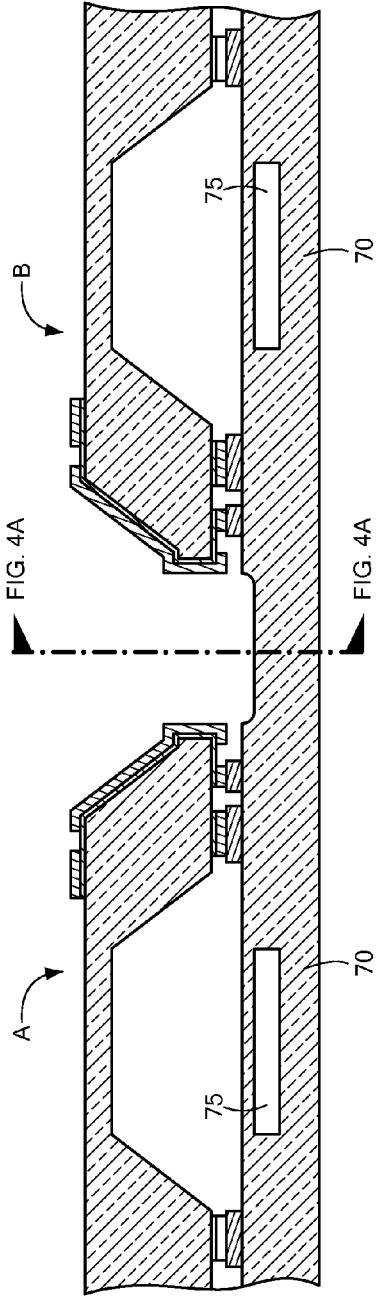
FIG. 3J is a diagram of a side elevation of composite wafer during singulation.

The cap wafer 35 can now be fixedly and operationally attached to the base wafer 70 (STEP 8) (FIG. 3I) and the resulting dies can be singulated (STEP 9) (FIG. 3J).

Attachment of the cap wafer 35 to the base wafer 70 (STEP 8) can be by any means known to those skilled in the art. For illustrative purposes only, manufacture by a flip-chip method is disclosed and shown illustratively herein. However, the invention is not to be construed or limited thereto.

As shown in FIG. 3I, the cap wafer 35 is positioned so that the lead wires, bumps, and/or pins 48 and the seal ring 58 on the front surface 33 of the cap wafer 35 are in registration with counterfacing, associated, and corresponding pins and/or bumps 74 and seal ring 72, respectively, on the base wafer 70. Moreover, cap wafer 35 and base wafer 70 are positioned so that the integrated circuitry 75 disposed in the base wafer 70 is in registration with the cavities 50 disposed on the front surface 33 of the cap wafer 35. The cavity 50 provides a sealed environment for the integrated circuitry 75 disposed in the base wafer 70.

The cap wafer 35 can be attached to the IC base wafer 70 (STEP 8) in the presence of an inert gas, dried air, another gas, a vacuum or another substance, which is then trapped within the cavity 50. Optionally, when the cap wafer 35 is attached to the IC base wafer 70 (STEP 8), some or all of the plenum between the cap wafer 35 and the IC base wafer 70 is filled within an organic glue or another filler.

When the cap wafer 35 and the IC base wafer 70 are assembled (STEP 8), the solder bumps or dots on the seal ring 58 are heated to soften, melt or otherwise activate the solder, glass, epoxy, and/or other materials between the cap wafer 35 and the seal ring 72 of the IC base wafer 70, and the cap wafer 35 and the IC base wafer 70 are pressed together. In pressing the wafers 35 and 70 together, care should be exercised to maintain an appropriate gap between the cap wafer 35 and the IC base wafer 70 while the solder, glass, epoxy, and/or other suitable attaching material hardens or cures. If the gap is too wide, the solder, glass, epoxy, and/or other suitable attaching material may not bond to the IC base wafer 70 adequately. On the other hand, if the cap wafer 35 and the IC base wafer 70 are pressed too closely together, the solder, glass, epoxy, and/or other suitable attaching material could be squeezed between the wafers 35 and 70 and spread, such as beyond the boundaries of the contact points.

As shown in FIG. 3J, after the cap wafer 35 and the IC base wafer 70 are fixedly attached and in operational and electrical communication (STEP 8), the composite wafer can be singulated, e.g., cut by a die saw, into discrete dies 72 [STEP 9]. FIG. 3J shows a saw cut between adjacent dies that provides die A and die B. Advantageously, the integrated circuitry 75 in the base wafer 70 is electrically-coupled to the cap wafer contact pads on the back surface 34 via the through-wafer hole, low aspect ratio side-wall electrical interconnections 16, without the use of wire bonding or die bonding.

Figure 4A:
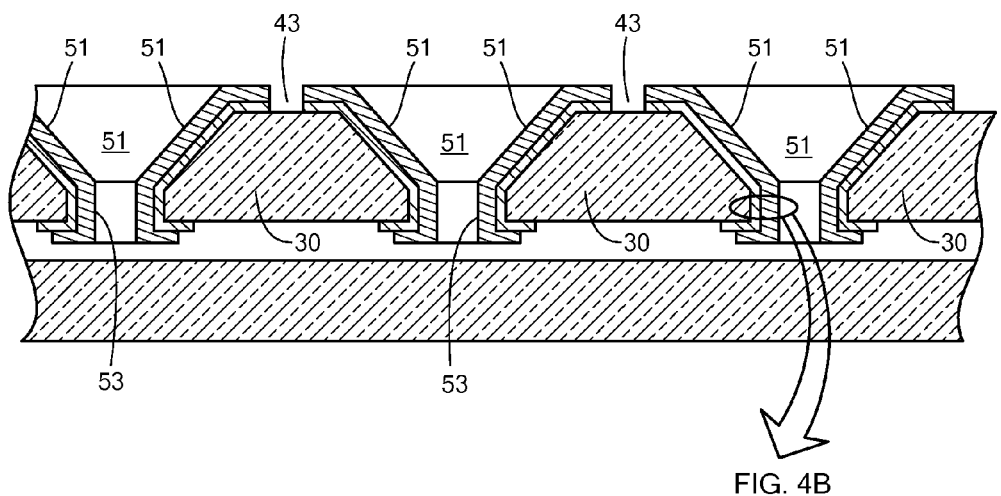
FIG. 4A is a diagram of a cross-section of the singulated composite wafer of FIG. 3J.
Figure 4B:
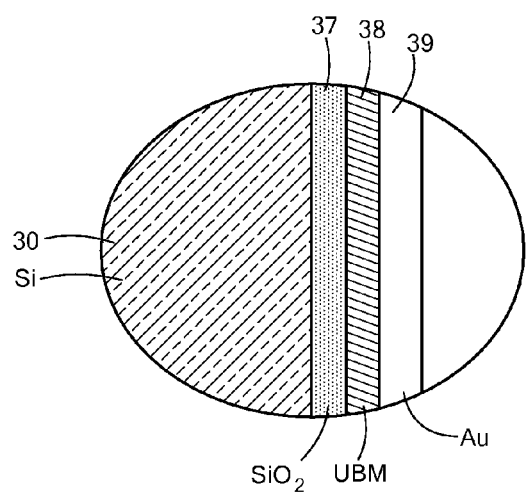
FIG. 4B is a blow-up section of the layering along the vertical wall portion of the interconnection via.
Figure 5:
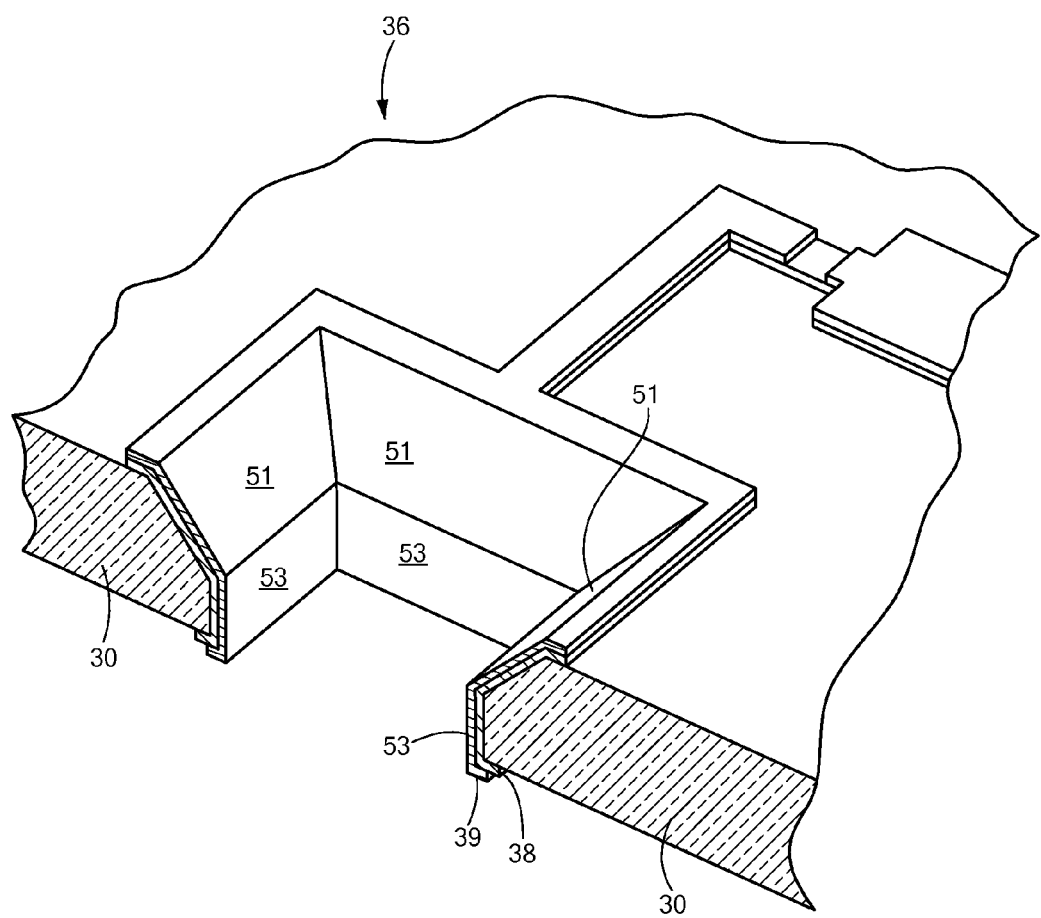
FIG. 5 is a diagram of an isometric view of the finished interconnection via.

FIG. 4A shows an elevation view of die B along the cut face and FIG. 5 shows an isometric view of a through-wafer hole, low aspect ratio electrical interconnection 36. The fashioned through-wafer hole interconnections 36 include a vertical or substantially vertical portion 53 and a low-aspect ratio sidewall portion 51. As shown in FIG. 4B, the through-wafer holes 36 consist of, from the surface of the silicon substrate 30, successive layers of silicon dioxide 37, UBM 38, and metal/solder material 39.

FIG. 6 shows an example of an possible end product cap wafer 35 from the front surface 33 and the back surface 34. The seal ring 58 encompasses the cavity 50.

Alternatively, the cap wafer 35 is cut without cutting the IC base wafer 70, to facilitate attaching an additional ("upper-story") one or more caps (with or without dies) to form a "multi-story" IC. In this case, the IC base wafer is cut at the same time as or after the front level cap is cut.

Optionally, prior to singulating the dies, the through-wafer holes 16 can be filled with an epoxy (not shown). The epoxies provide the exposed metal/solder material 39 with additional protection from a harsh operating environment.

The manufacture of a cap wafer 35 for an alternative packaged IC will now be disclosed. The flowchart of the method of manufacture is essentially the same as that shown in FIG. 9, however, the end product cap wafer and the end product composite wafer (FIG. 8) differ from those shown in FIG. 6. FIGS. 7A to 7H illustrate intermediate stages during fabrication of the alternative wafer-level packaged IC.

The first three manufacturing steps of the alternative packaged IC are identical to STEP 1 and STEP 2 previously described and shown in FIGS. 3A and 3B. Briefly, masking layers of SiO 31 and SiN 32 are grown or deposited on the front and back surfaces 33 and 34 of a polished silicon substrate 30. A patterned photo-resist is applied to the exposed SiN layer 32 on the front and back surfaces 33 and 34. A first wet or dry chemical etchant removes those portions of the SiO 31 and SiN layers 32 that are not covered by the photo-resist pattern.

Application of a second wet chemical etchant further removes those portions of the silicon substrate 30 that are not covered by the SiO and SiN 31 and 32 masking layers. The SiO and SiN layers 31 and 32 are removed from both surfaces 33 and 34 of the cap wafer 35. The resulting cavities 50 in the silicon substrate 30 have low aspect ratios on the order of about 1:1 (rise:run) or flatter.

Figure 7A:
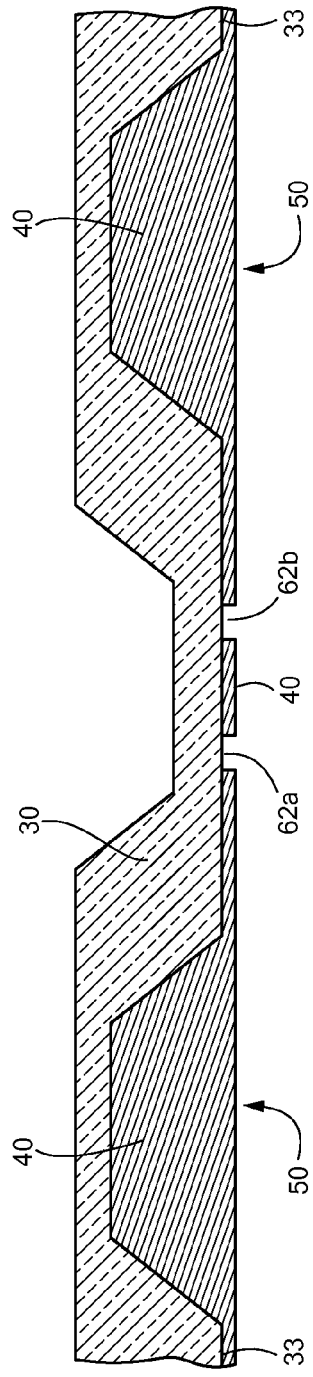
FIG. 7A is a diagram of the silicon substrate and photo-resist mask for providing interconnection vias.
Figure 7B:
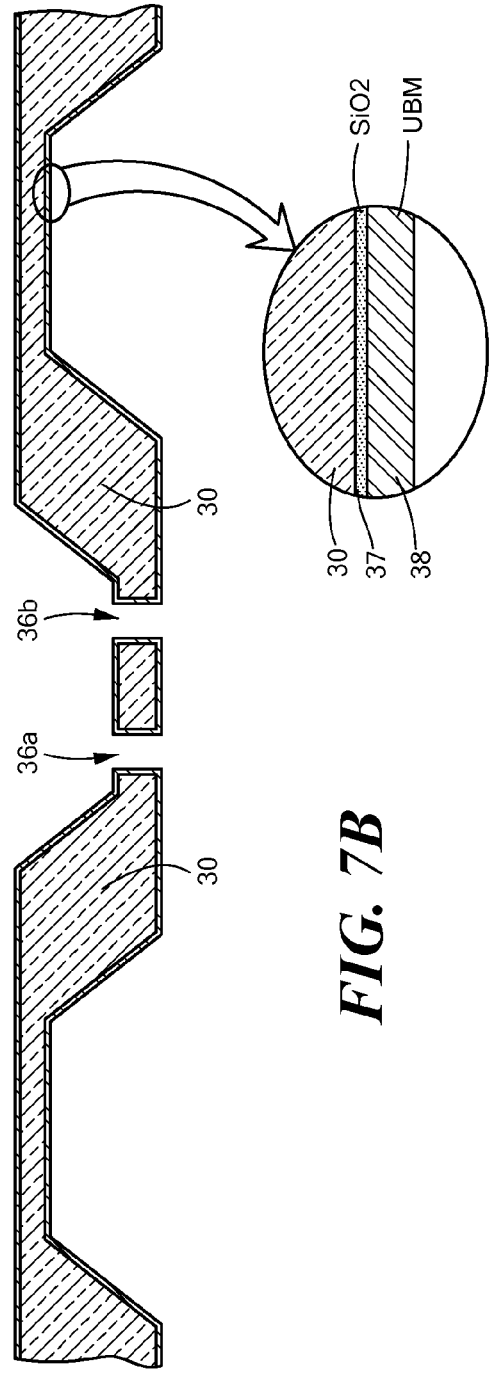
FIG. 7B is a diagram of the silicon substrates with an interconnection via therebetween.
Figure 7C:
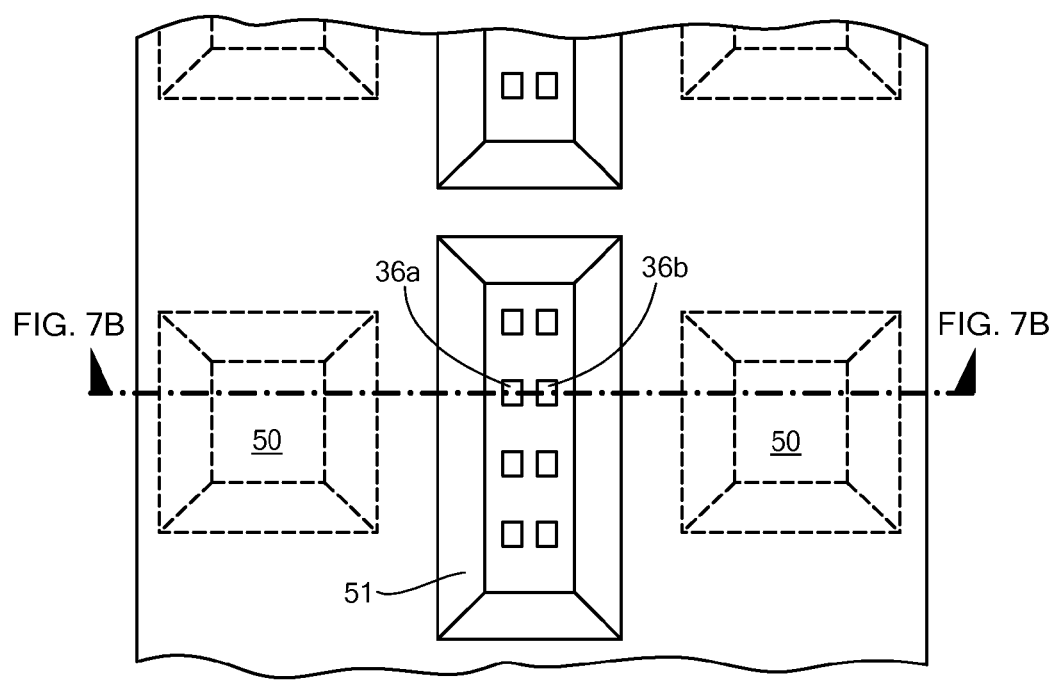
FIG. 7C is a diagram of a plan view of the silicon substrate in FIG. 7B.

In a next step, as shown in FIG. 7A, a photo-resist 40 can be applied to the front surface 33 of the cap wafer 35 to mask the cavities 50 to provide a plurality of smaller opening vias. The pattern of the photo-resist mask 40 substantially covers all of the front surface 33 of the cap wafer 35, leaving only small openings 62a and 62b where through-wafer holes 16 are desired.

A wet or dry chemical etchant can then be applied to the front surface 33 of the cap wafer 35 to remove any unmasked silicon. This provides a plurality of small opening vias 36a and 36b (STEP 3). The chemical etchant that is applied should react with so as to remove the silicon in the substrate 30 but should not react with the photo-resist 40. Once the silicon has been removed by the etchant, the photo-resist 40 can be removed.

As shown in elevation (FIG. 7B) and plan view (FIG. 7C), once all of the silicon has been removed, numerous, small vias 36a and 36b have been provided in back surface cavity 50. Those skilled in the art will appreciate that the number and pattern of the small vias 36a and 36b can be varied to suit packaging needs.

As described previously with respect to the first methodology, a layer of $SiO_2$ 37 is grown or deposited on the silicon substrate 30 and a UBM layer 38 is deposited on or applied to the layer of $SiO_2$ 37 (STEP 4). A photo-resist mask 40 can then be electro-plated or spray coated onto the front and back surfaces 33 and 35 of the cap wafer 35. An illustrative masking pattern 79 is shown in FIG. 7D.

A metal/solder mixture 39 is then deposited on the unmasked portions of the UBM layer 38 on both the front and back surfaces 33 and 34 and on the vias 36a and 36b of the cap wafer 35 (STEP 5). As shown in plan view in FIG. 7E, when compared to FIG. 5 of the first methodology, use of the small vias 36a and 36b substantially reduces the amount of metal/solder mixture 39 that is deposited on the low-aspect ratio side-walls 51 and on the vertical or substantially vertical surface 53. Moreover, the second methodology can provide a higher density of interconnects 16.

As shown in FIG. 7F, a photo-resist mask 60 is then applied to the metal/solder portions 39 on both the front and back surfaces 33 and 34 of the cap wafer 35. An insulation region 59 is left unmasked on the front surface 33 of the cap wafer 35, to provide an electric insulator 59 between the electrode 48 and the sealing ring 58 (STEP 6).

The UBM 38 in the unmasked insulation region 59 is then etched away, e.g., using a dry or a wet etchant (STEP 6), leaving the $SiO_2$ layer 37. The etchant should react with so as to be able to remove the UBM layer 38 without removing and $SiO_2$ layer 37, the silicon substrate 30, the metal/solder portions 39 or the photo-resist material 60.

After the photo-resist 60 has been removed, the cap wafer 35 can be annealed, e.g., at a temperature of about 450 degrees Centigrade (STEP 7). Annealing forms the solder dam portions 46 and 43 on the front and back surfaces 33 and 34 of the cap wafer 35, respectively (FIG. 7G).

Figure 7H:
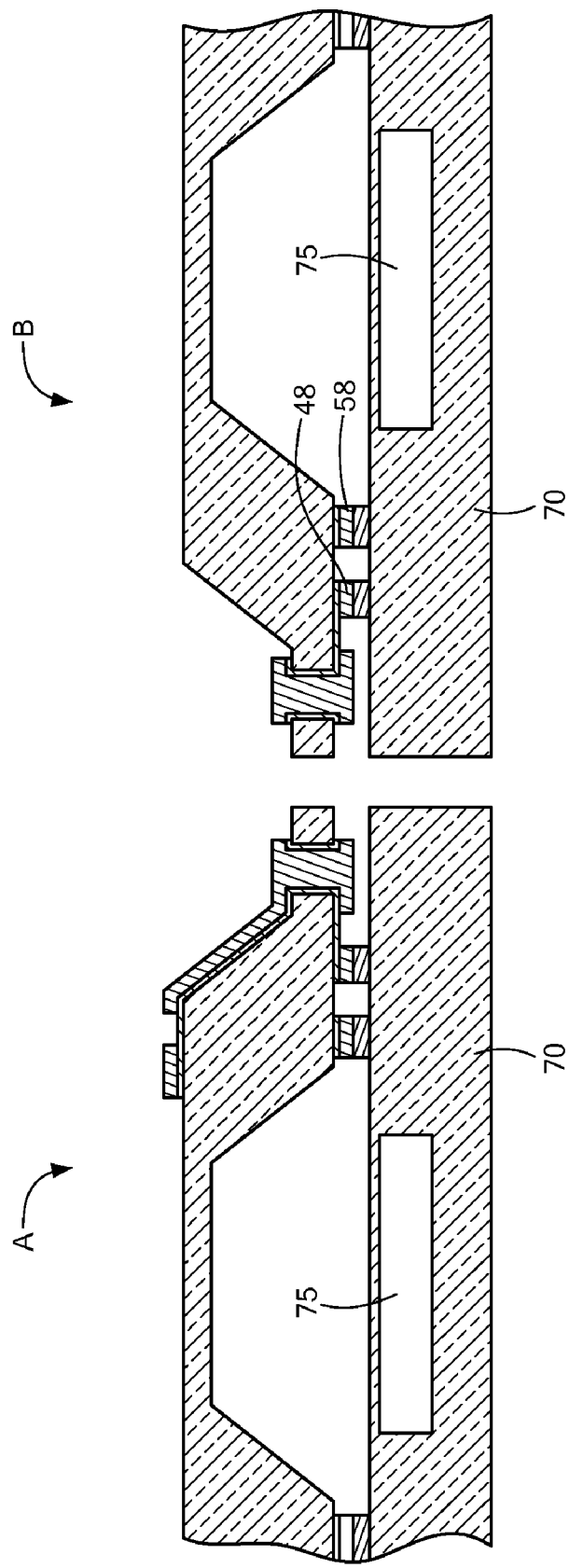
FIG. 7H is a diagram of a side elevation of composite wafer during singulation.

The cap wafer 35 can now be fixedly and operationally attached to the base wafer 70 (STEP 8) and the resulting dies can be singulated (STEP 9) (FIG. 7H).

Attachment of the cap wafer 35 to the base wafer 70 again can be by any means known to those skilled in the art. For illustrative purposes only, a flip-chip method of manufacture is disclosed herein. However, the invention is not to be construed or limited thereto.

Figure 8:
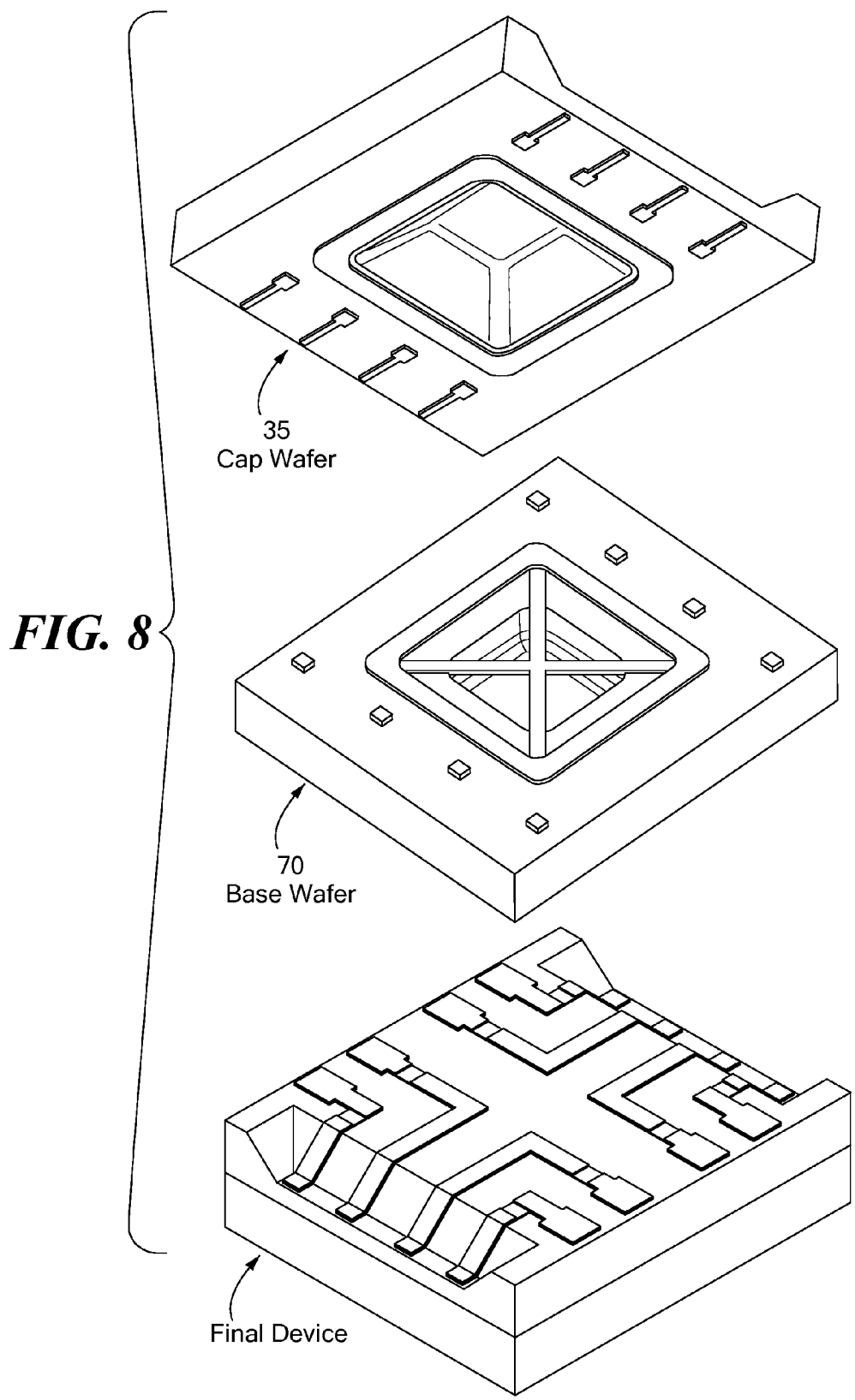
FIG. 8 is a diagram of an alternative end product cap wafer, base wafer, and composite wafer in accordance with a method of manufacturing according to the present invention.

Once the cap wafer 35 and base wafer 70 are fixedly attached and are in operational communication, the whole can be singulated, e.g., laser cut, saw cut, and similar precise methods of separating adjacent dies, into discrete dies. FIG. 7H shows a saw cut between adjacent dies that provides die A and die B. The end product cap wafer 35 and composite wafer are shown in FIG. 8.

It will be apparent to those of ordinary skill in the art that modifications to and variations of the above-described system and method may be made without departing from the inventive concepts described herein. Accordingly, the invention should not be limited except by the scope and spirit of the appended claims.

What is claimed is:

1. A method of manufacturing wafer-level packages for integrated circuits, the wafer-level packages comprising a base wafer that is fixedly attached to and in operational association with a cap wafer having a through-wafer electrical interconnection, the method comprising:
   providing cavities having low-aspect ratio side-walls on both a front surface and a back surface of a polished semiconductor substrate;
   providing an interconnection via between adjacent front surface cavities using a cavity disposed on the back surface;
   applying a highly-electrically conductive metal/solder to surfaces of the interconnection via to provide through-wafer, low aspect ratio side-wall, electrical interconnections; and
   fixedly attaching the cap wafer to the base wafer to form a composite wafer, wherein electrical contact points disposed on a front surface of the base wafer are electrically-coupled to the through-wafer, low aspect ratio side-wall electrical interconnections on the front surface of the cap wafer, and the through-wafer, low aspect ratio side-wall, electrical interconnections on the cap wafer are electrically-coupled to electrical contact points disposed on the rear surface of the cap wafer.

2. The method as recited in claim 1, wherein providing cavities having low-aspect ratio side-walls includes providing side-wall slopes that are no steeper than 1 vertical:1 horizontal.

3. The method as recited in claim 1, wherein the method further includes annealing the cap wafer prior to fixedly attaching and electrically-coupling the cap wafer to the IC base wafer.

4. The method as recited in claim 1, wherein the method further includes filing the pre-cut interconnection via with a protective epoxy after fixedly attaching and electrically-coupling the cap wafer to the IC base wafer.

5. The method as recited in claim 1, wherein the method further includes singulating the composite wafer after fixedly attaching the cap wafer to the base wafer, to provide plural composite wafer dies.

6. The method as recited in claim 1, wherein the highly-electrically conductive metal/solder is applied to the interconnection via using electroplating, chemical vapor deposition or sputtering.

7. The method as recited in claim 1, wherein the highly-electrically conductive metal/solder applied includes metals for the group comprising gold, platinum or silver and the solder includes tin solder.

8. The method as recited in claim 7, wherein the through-wafer, side-wall electrical interconnections include a low aspect ratio side-wall portion in combination with a low-height, vertical or substantially vertical side-wall portion.

9. The method as recited in claim 8, wherein the low aspect ratio side-wall portion of the through-wafer, side-wall electrical interconnections is in direct communication with the rear surface of the cap wafer at a first end and with the vertical or substantially vertical side-wall portion at a second end.

10. The method as recited in claim 8, wherein the vertical or substantially vertical side-wall portion of the through-wafer hole, side-wall electrical interconnections is in direct communication with the front surface of the cap wafer at a first end and with the low aspect ratio side-wall portion at a second end.

11. The method as recited in claim 1, wherein the electrically conductive side-wall paths include a low aspect ratio side-wall portion in combination with a vertical or substantially vertical side-wall portion.

12. The method as recited in claim 11, wherein the low aspect ratio side-wall portion of the electrically conductive side-wall paths is in direct communication with the rear surface of the first semiconductor cap wafer at a first end and with the vertical or substantially vertical side-wall portion at a second end.

13. A method of wafer-level packaging integrated circuit (IC) dies, comprising:
   providing an IC base wafer comprising a plurality of dies and at least one electrical contact point associated with each die;
   providing a first semiconductor cap wafer;
   forming electrically conductive side-wall paths having low aspect ratio portions through the first semiconductor cap wafer at positions corresponding to respective ones of the electrical contact points on the IC base wafer, such that each electrically conductive side-wall path extends from a first side of the first semiconductor cap wafer to a second side of the first semiconductor cap wafer and is insulated from at least a portion of the first semiconductor cap wafer; and
   before singulating the dies from the IC base wafer, attaching the first semiconductor cap wafer to the IC base wafer to form a composite wafer, such that the ends of the conductive paths on the first side of the first semiconductor cap wafer are electrically-coupled to the respective electrical contact points on the IC base wafer.

14. The method as recited in claim 13, wherein the low-aspect ratio side-wall portions are formed having side-wall slopes that are no steeper than 1 horizontal:1 vertical.

15. The method as recited in claim 13, wherein the method further includes annealing the first semiconductor cap wafer prior to fixedly attaching and electrically-coupling the said first semiconductor cap wafer to the IC base wafer.

16. The method as recited in claim 13, wherein the method further includes filing any openings in the side-wall paths with a protective epoxy after fixedly attaching and electrically-coupling the first semiconductor cap wafer to the IC base wafer; and precutting the cap wafer.

17. The method as recited in claim 13, wherein the method further includes singulating the composite wafer after attaching the first semiconductor cap wafer to the base wafer, to provide plural composite wafer dies.

18. The method as recited in claim 13, wherein the electrically conductive side-wall paths are formed using highly-electrically conductive metal/solder that is applied using electroplating, chemical vapor deposition or sputtering.

19. The method as recited in claim 13, wherein the electrically conductive side-wall paths are formed using highly-electrically conductive metal/solder applied that includes metals for the group comprising gold, platinum or silver and the solder includes tin solder.

* * * * *

UNITED STATES PATENT AND TRADEMARK OFFICE
CERTIFICATE OF CORRECTION

| | | |
|---|---|---|
| PATENT NO. | : 7,495,462 B2 | Page 1 of 1 |
| APPLICATION NO. | : 11/505046 | |
| DATED | : February 24, 2009 | |
| INVENTOR(S) | : Yaping Hua et al. | |

It is certified that error appears in the above-identified patent and that said Letters Patent is hereby corrected as shown below:

Column 7, line 55, "URM" should read --UBM--; and

Column 12, claim 16, line 66, "precutting" should read --pre-cutting--.

Signed and Sealed this

Twenty-sixth Day of May, 2009

JOHN DOLL
*Acting Director of the United States Patent and Trademark Office*